(12) United States Patent
Hirai et al.

(10) Patent No.: US 12,345,772 B2
(45) Date of Patent: Jul. 1, 2025

(54) BATTERY DETERIORATION DIAGNOSIS DEVICE AND BATTERY DETERIORATION DIAGNOSIS METHOD

(71) Applicant: Mitsubishi Electric Corporation, Tokyo (JP)

(72) Inventors: Seiji Hirai, Tokyo (JP); Tomoki Takegami, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 65 days.

(21) Appl. No.: 18/266,284

(22) PCT Filed: Feb. 2, 2021

(86) PCT No.: PCT/JP2021/003706
§ 371 (c)(1),
(2) Date: Jun. 9, 2023

(87) PCT Pub. No.: WO2022/168151
PCT Pub. Date: Aug. 11, 2022

(65) Prior Publication Data
US 2024/0044994 A1   Feb. 8, 2024

(51) Int. Cl.
*G01R 31/392* (2019.01)
(52) U.S. Cl.
CPC ................... *G01R 31/392* (2019.01)
(58) Field of Classification Search
None
See application file for complete search history.

(56) References Cited

U.S. PATENT DOCUMENTS

| | | | |
|---|---|---|---|
| 2005/0149280 A1* | 7/2005 | Sharma | G01R 31/386 702/63 |
| 2012/0112695 A1 | 5/2012 | Nishi et al. | |
| 2014/0266060 A1* | 9/2014 | Ying | H02J 7/005 320/134 |
| 2017/0212170 A1* | 7/2017 | Torai | H01M 10/482 |
| 2018/0252774 A1* | 9/2018 | Ciaccio | G01R 31/388 |

(Continued)

FOREIGN PATENT DOCUMENTS

| | | |
|---|---|---|
| JP | 2011-018533 A | 1/2011 |
| JP | 2013-019709 A | 1/2013 |

(Continued)

OTHER PUBLICATIONS

International Search Report and Written Opinion mailed on Apr. 20, 2021, received for PCT Application PCT/JP2021/003706, filed on Feb. 2, 2021, 11 pages including English Translation.

*Primary Examiner* — Jas A Sanghera
(74) *Attorney, Agent, or Firm* — XSENSUS LLP

(57) ABSTRACT

After the temperature of a battery rises to a predetermined diagnosis temperature, a charge/discharge control unit controls a charge/discharge circuit to charge or discharge the battery. A current-voltage detection unit detects current and voltage of the battery during a period in which the battery is charged or discharged. A differential voltage calculation unit calculates a differential voltage of the battery on the basis of the detected current and voltage. A deterioration state estimation unit estimates a deterioration state of the battery on the basis of a change in the calculated differential voltage.

13 Claims, 11 Drawing Sheets

(56) References Cited

U.S. PATENT DOCUMENTS

| | | | |
|---|---|---|---|
| 2018/0278064 A1 | 9/2018 | Kikuchi et al. | |
| 2019/0064282 A1* | 2/2019 | Haga ..................... | H01M 10/42 |
| 2021/0096189 A1* | 4/2021 | Arima .................. | G01R 31/367 |

FOREIGN PATENT DOCUMENTS

| | | |
|---|---|---|
| JP | 2014-163875 A | 9/2014 |
| JP | 2017-168361 A | 9/2017 |
| JP | 2019-056595 A | 4/2019 |
| JP | 6500789 B2 | 4/2019 |
| WO | 2016/147311 A1 | 9/2016 |
| WO | 2019/181138 A1 | 9/2019 |

* cited by examiner

BATTERY DETERIORATION DIAGNOSIS DEVICE AND BATTERY DETERIORATION DIAGNOSIS METHOD

CROSS-REFERENCE TO RELATED APPLICATION

The present application is based on PCT filing PCT/JP2021/003706, filed Feb. 2, 2021, the entire contents of which are incorporated herein by reference.

TECHNICAL FIELD

The present disclosure relates to a battery deterioration diagnosis device and a battery deterioration diagnosis method of diagnosing the deterioration of a battery.

BACKGROUND ART

In recent years, electric vehicles such as electric cars and hybrid electric cars have been put into practical use in order to reduce environmental loads. Stationary battery systems are also widely used to utilize renewable energies.

These apparatuses use batteries such as lithium-ion batteries. As batteries are used, they deteriorate and their performance decreases. Therefore, the life of batteries must be estimated, and batteries must be replaced at the appropriate time. Therefore, deterioration diagnosis is needed to estimate the deterioration state of the battery.

One of the battery deterioration diagnosis methods is to use a change in a differential value of the voltage of the battery (hereinafter referred to as a differential voltage). For example, the positions of peaks and the distance between the peaks that appear in a differential voltage curve, which represents the change in the differential voltage, change as the battery deteriorates. Therefore, by measuring the voltage and current of the battery and determining the change in the differential voltage from the measured values, the deterioration state of the battery can be estimated nondestructively.

For example, in the secondary battery system described in Patent Document 1, a differential curve representing the relationship between the voltage V and dQ/dV, which is the ratio of the change amount dQ of the electrical volume Q to the change amount dV of the voltage V, is calculated, and the deterioration index of the secondary battery is estimated on the basis of the characteristic points in the predetermined region of the differential curve.

PRIOR ART DOCUMENT

Patent Document

Patent Document 1: Japanese Unexamined Patent Publication No. 2019-056595

SUMMARY OF INVENTION

Technical Problem

In order to measure such characteristic changes (peaks) in the differential voltage curve, it is necessary to charge/discharge the battery with a small current. This increases the time required for the deterioration diagnosis. On the other hand, when the current is large, the characteristic changes cannot be measured, and the accuracy of the deterioration diagnosis is reduced.

An object of the present disclosure is to solve the above problems and to obtain a battery deterioration diagnosis device and a battery deterioration diagnosis method that can perform the deterioration diagnosis of the battery in a short time and with high accuracy.

Solution to Problem

A battery deterioration diagnosis device according to the present disclosure is a battery deterioration diagnosis device that performs deterioration diagnosis of a battery and includes: a charge/discharge circuit to charge or discharge the battery; a charge/discharge control unit to control the charge/discharge circuit in such a way that the battery is charged or discharged after a temperature of the battery rises to a predetermined diagnosis temperature; a current-voltage detection unit to detect current and voltage of the battery during a period in which the battery is charged or discharged by the charge/discharge control unit; a differential voltage calculation unit to calculate a differential value of the voltage of the battery as a differential voltage on the basis of the current and voltage detected by the current-voltage detection unit; and a deterioration state estimation unit to estimate a deterioration state of the battery on the basis of a change in the differential voltage calculated by the differential voltage calculation unit.

A battery deterioration diagnosis method according to the present disclosure is a battery deterioration diagnosis method of performing deterioration diagnosis of a battery and includes: a step of raising a temperature of the battery to a predetermined diagnosis temperature; a step of controlling a charge/discharge circuit in such a way that the battery is charged or discharged after the temperature of the battery rises to the diagnosis temperature; a step of detecting current and voltage of the battery by a current-voltage detection unit during a period in which the battery is charged or discharged by the charge/discharge circuit; a step of calculating a differential value of the voltage of the battery as a differential voltage on the basis of the current and voltage detected by the current-voltage detection unit; and a step of estimating a deterioration state of the battery on the basis of a change in the differential voltage calculated by a differential voltage calculation unit.

Advantageous Effects of Invention

According to the battery deterioration diagnosis device and deterioration diagnosis method of the present disclosure, the deterioration diagnosis of the battery can be performed with high accuracy in a short time.

DESCRIPTION OF EMBODIMENTS

Hereinafter, a battery deterioration diagnosis device and a battery deterioration diagnosis method according to embodiments of the present disclosure will be described with reference to drawings.

Embodiment 1

Figure 1:
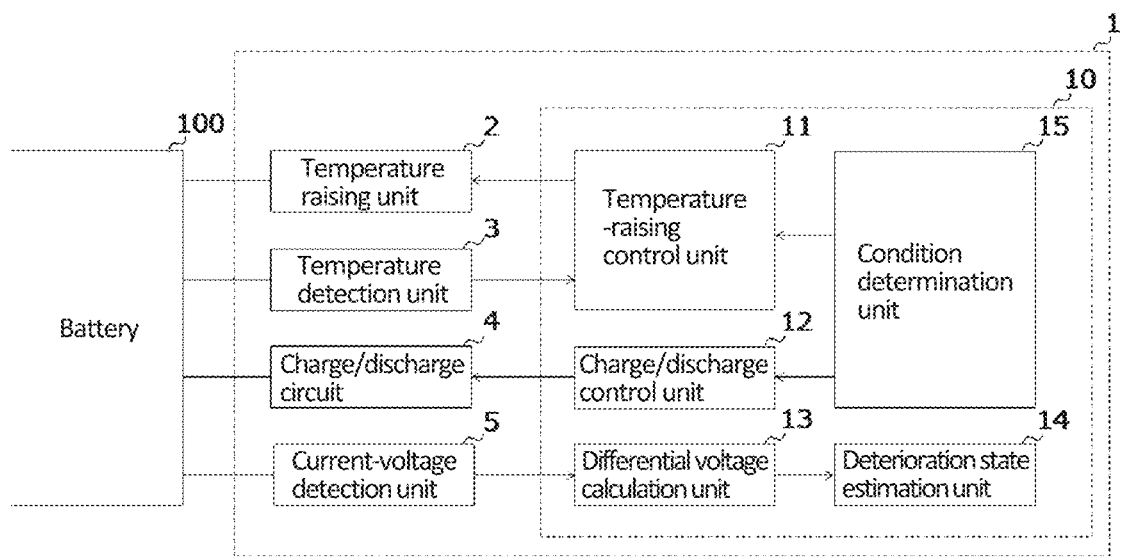
FIG. 1 is a diagram showing an overall configuration of a battery deterioration diagnosis device according to Embodiment 1 of the present disclosure.

FIG. 1 is a diagram showing an overall configuration of a battery deterioration diagnosis device according to Embodiment 1 of the present disclosure. As shown in FIG. 1, the battery deterioration diagnosis device 1 performs deterioration diagnosis of a battery 100 including a temperature raising unit 2, a temperature detection unit 3, a charge/discharge circuit 4, a current-voltage detection unit 5, and a control unit 10. The battery 100 only needs to be able to be charged and discharged, and for example, a lithium-ion battery is used as the battery 100. The battery 100 may be other batteries that can be charged and discharged, such as lead-acid batteries, nickel-metal hydride batteries, all-solid-state batteries, etc. The battery 100 may be a single cell (unit cell) or may include a plurality of cells as in Embodiment 5 described later.

The temperature raising unit 2 raises the temperature of the battery 100 (hereinafter referred to as battery temperature). The temperature raising unit 2 raises the battery temperature by, for example, applying heat to the battery 100 from outside the battery 100. In that case, the temperature raising unit 2 includes, for example, a heater or an air conditioner. Alternatively, as in Embodiment 4 described later, the temperature raising unit 2 may pass a current through the battery 100 to generate heat inside the battery 100, thereby raising the battery temperature. In the example of FIG. 1, the battery deterioration diagnosis device 1 includes the temperature raising unit 2, but the temperature raising unit 2 may be provided as an external device of the battery deterioration diagnosis device 1.

The temperature detection unit 3 detects the temperature (battery temperature) of the battery 100. The temperature detection unit 3 includes, for example, a thermistor. The battery temperature detected by the temperature detection unit 3 is given as temperature information to a temperature-raising control unit 11 described later. The charge/discharge circuit 4 charges and discharges the battery 100. The charge/discharge circuit 4 includes, for example, a plurality of switching elements.

The current-voltage detection unit 5 detects the current and voltage of the battery 100 at the time of charge/discharge of the battery 100 by the charge/discharge circuit 4. The current of the battery 100 is the current flowing through the battery 100, and the voltage of the battery 100 is the voltage between the terminals of the battery 100. Hereinafter, the current of the battery 100 is referred to as a battery current, and the voltage of the battery 100 is referred to as a battery voltage. The current-voltage detection unit 5 includes, for example, a current sensor and a voltage detection line, and detects the battery current by the current sensor and the battery voltage by the voltage detection line. The battery current and the battery voltage detected by the current-voltage detection unit 5 are given as current-voltage information to a differential voltage calculation unit 13 described later.

The control unit 10 includes the temperature-raising control unit 11, a charge/discharge control unit 12, the differential voltage calculation unit 13, a deterioration state estimation unit 14, and a condition determination unit 15.

The temperature-raising control unit 11 controls the temperature raising unit 2 in such a way that the battery temperature rises to a predetermined diagnosis temperature on the basis of the temperature information from the temperature detection unit 3. When the temperature raising unit 2 is provided as an external device of the battery deterioration diagnosis device 1, the temperature-raising control unit 11 may also be provided as the external device of the battery deterioration diagnosis device 1. For example, when the temperature raising unit 2 is an air conditioner, a controller mounted on the air conditioner may control the battery temperature as the temperature-raising control unit 11.

The charge/discharge control unit 12 controls the charge/discharge of the battery 100 by controlling the charge/discharge circuit 4. At the time of deterioration diagnosis, the charge/discharge control unit 12 controls the charge/discharge circuit 4 in such a way that the battery 100 is charged or discharged after the temperature of the battery 100 rises to the above-described diagnosis temperature.

During the period in which the charge/discharge of the battery 100 is performed, the differential voltage calculation unit 13 calculates, as the differential voltage, the differential value of the voltage of the battery 100 on the basis of the current-voltage information from the current-voltage detection unit 5. In the present embodiment, the differential voltage calculation unit 13 calculates, as the differential voltage, a value dV/dQ obtained by differentiating the battery voltage V by an electrical volume Q of the battery 100. The electrical volume Q is obtained from the battery current. By repeatedly calculating the differential voltage (dV/dQ) by the differential voltage calculation unit 13 while changing the electrical volume Q of the battery 100 by charging or discharging the battery 100, a differential voltage curve (dV/dQ–Q) representing the relationship between the differential voltage (dV/dQ) and the electrical volume Q is obtained. The differential voltage curve (dV/dQ–Q) represents a change in the differential voltage (dV/dQ) with respect to the electrical volume Q.

The deterioration state estimation unit 14 estimates a deterioration state of the battery 100 on the basis of the change in the differential voltage calculated by the differential voltage calculation unit 13. For example, the deterioration state estimation unit 14 estimates a State Of Health (SOH) as the deterioration state of the battery 100 on the basis of the shapes of peaks appearing in the differential voltage curve or the distances between the peaks. The SOH is the ratio of the current full charge capacity (Ah) to the initial (before-deterioration) full charge capacity (Ah) of the battery 100, and represents the degree of health of the battery 100. The deterioration state estimation unit 14 may calculate, as the deterioration state, the internal resistance of the battery 100 or the like instead of the SOH.

Figure 2:
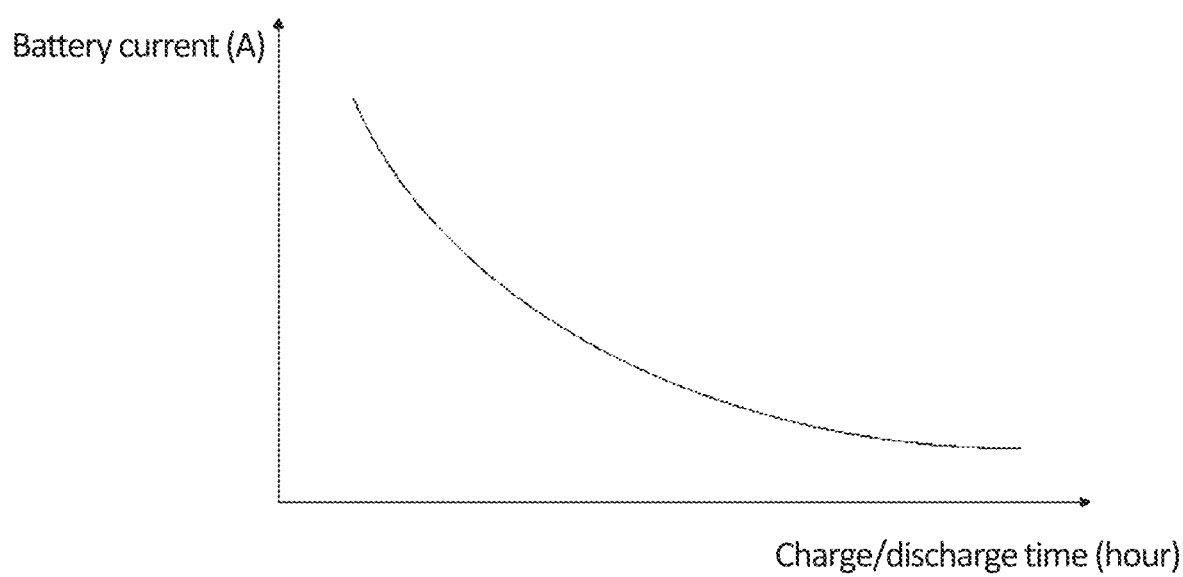
FIG. 2 is a diagram showing an example of a relationship between a charge/discharge time and a battery current.
Figure 3:
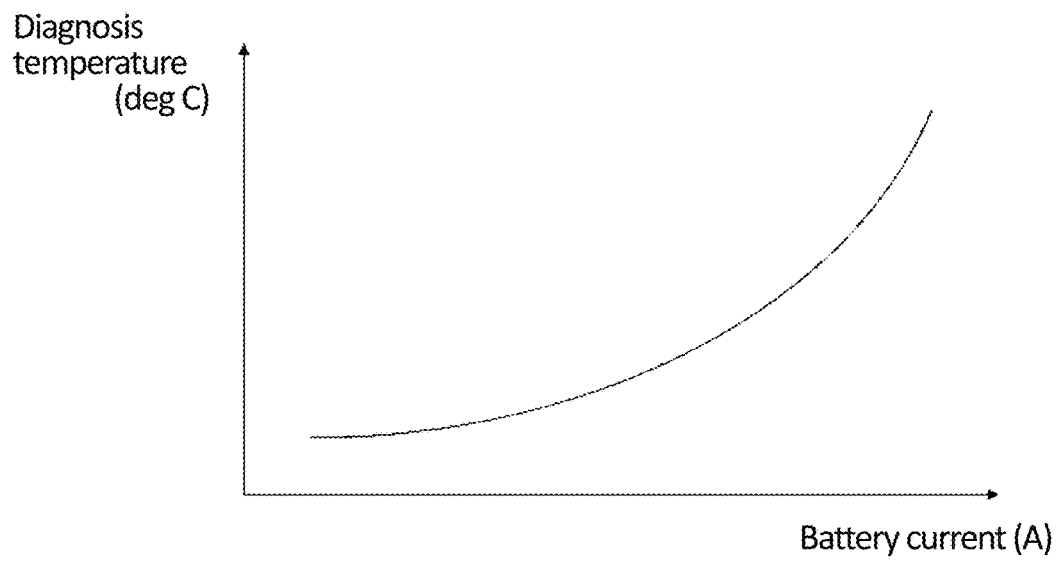
FIG. 3 is a diagram showing an example of a relationship between the battery current and a diagnosis temperature.

The condition determination unit 15 determines, as diagnosis conditions, the battery current, the diagnosis temperature, and a charge/discharge time at the time of deterioration diagnosis. The charge/discharge time is a time during which the charge/discharge of the battery 100 is performed in order for the differential voltage calculation unit 13 to calculate the differential voltage. FIG. 2 is a diagram showing an example of a relationship between the charge/discharge time and the battery current, and FIG. 3 is a diagram showing an example of a relationship between the battery current and the diagnosis temperature. For example, a user operates an operation unit (not shown) to input the charge/discharge time. The charge/discharge time depends on the battery current, and as shown in FIG. 2, the larger the battery current, the shorter the charge/discharge time. The condition determination unit 15 then determines the charge/discharge time on the basis of the user's input and determines the battery current on the basis of the charge/discharge time. The condition determination unit 15 also determines the diagnosis temperature on the basis of the battery current. As shown in FIG. 3, the diagnosis temperature is determined to be a higher value as the battery current is larger. The relationship between the battery current and the diagnosis temperature will be described later. In this way, the battery current, the diagnosis temperature, and the charge/discharge time are determined as the diagnosis conditions. The relationships between the battery current, the diagnosis temperature, and the charge/discharge time as shown in FIG. 2 and FIG. 3 may be stored in advance by means of a look-up table.

For time savings, the charge/discharge time is preferably short. On the other hand, frequent charge/discharge of the battery 100 by large battery current is likely to accelerate the deterioration of the battery 100. Therefore, when time is available, it is preferable that the charge/discharge time be set long and the battery current be set low.

Figure 4:
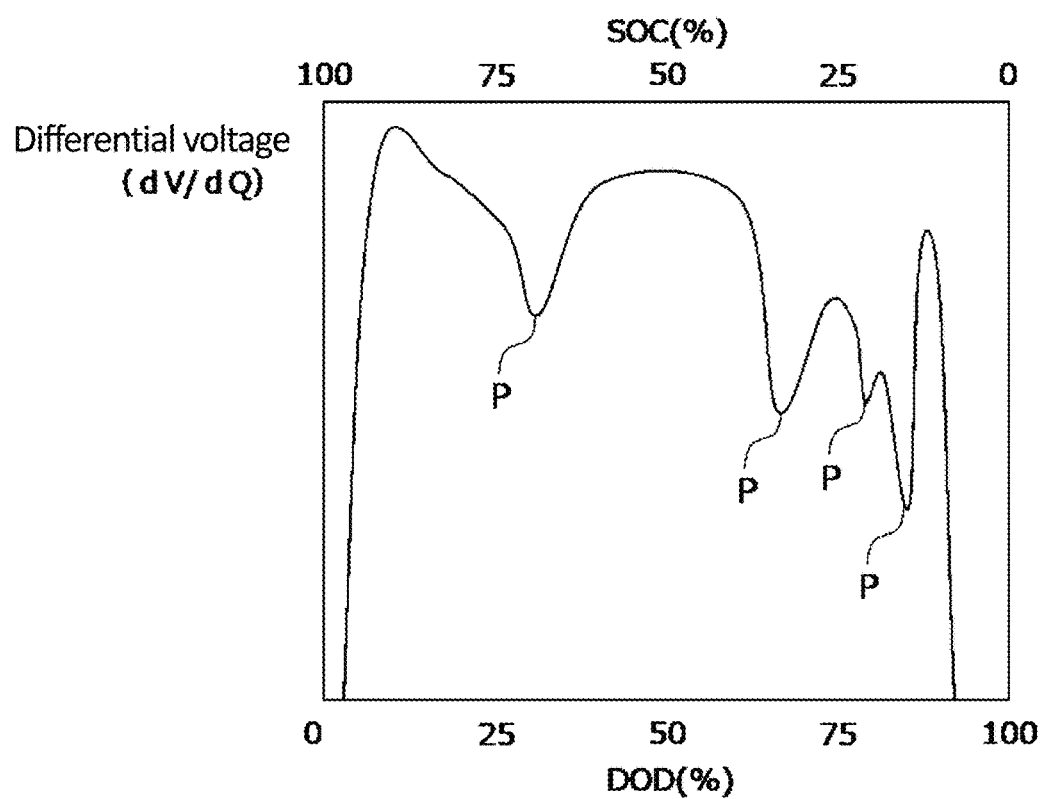
FIG. 4 is a diagram showing an example of a differential voltage curve.

FIG. 4 is a diagram showing an example of the differential voltage curve. The horizontal axes represent a State Of Charge (SOC) and a Depth Of Discharge (DOD), and the vertical axis represents the differential voltage dV/dQ. The SOC represents the ratio of the remaining volume to the full charge capacity of the battery 100 as a percentage, and the DOD represents the ratio of a discharge amount to the full charge capacity of the battery 100 as a percentage. The relationship between the SOC and the DOD is expressed as "100−DOD=SOC". The SOC and the DOD represent the electrical volume of the battery 100.

As shown in FIG. 4, the differential voltage curve has a plurality of peaks P. Such peaks P appear due to the effect of the phase change in the cathode and anode materials of the battery 100. Meanwhile, the battery voltage is affected by the internal resistance of the battery 100. That is, when the internal resistance is different, the differential voltage is different. The larger the battery current, the larger the effect of the internal resistance.

If the effect of the internal resistance is large, the effect of the internal resistance is more dominant than the effect of the phase change in the differential voltage curve, and the effect of the phase change is less likely to appear in the differential voltage curve. In other words, distinct peaks are unlikely to appear in the differential voltage curve. If the peaks are not distinct, it is difficult to accurately estimate the deterioration state of the battery 100. One way to suppress the effect of the internal resistance is to reduce the battery current. However, reducing the battery current increases the charge/discharge time of the battery 100.

In the present embodiment, the battery temperature is adjusted instead of adjusting the battery current to suppress the effect of the internal resistance. The internal resistance of the battery 100 depends on the battery temperature. As the battery temperature increases, the internal resistance decreases. Therefore, the effect of the internal resistance can be suppressed by raising the battery temperature to the diagnosis temperature before the charge/discharge of the battery 100 and then performing the charge/discharge of the battery 100 in that state. This allows distinct peaks to appear in the differential voltage curve without reducing the battery current.

Figure 5:
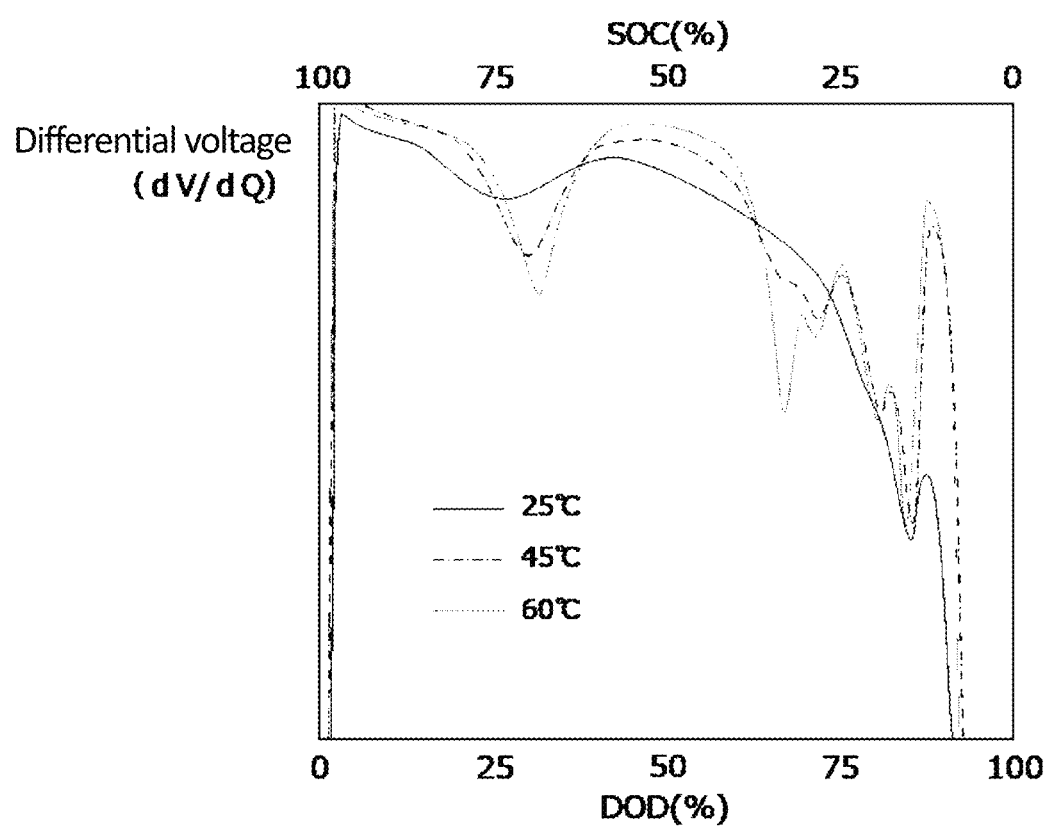
FIG. 5 is a diagram for explaining differences in differential voltage curves at different battery temperatures.
Figure 6:
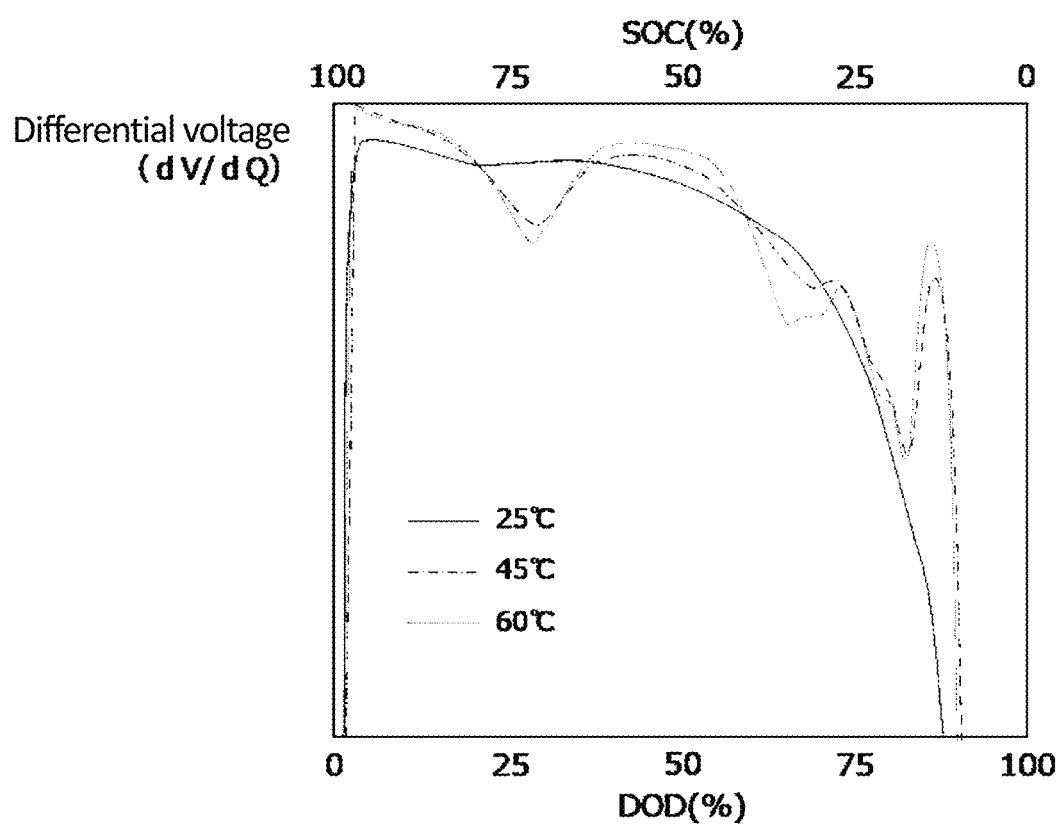
FIG. 6 is a diagram for explaining differences in differential voltage curves at the different battery temperatures.

FIG. 5 and FIG. 6 are diagrams for explaining the differences in differential voltage curves at different battery temperatures. The horizontal axes represent the SOCs and the DODs, which are the electrical capacities, and the vertical axes represent differential voltage values dV/dQ.

FIG. 5 shows the differential voltage curves when the battery temperatures are set to 25 deg C., 45 deg C., and 60 deg C. and the battery is discharged at 0.5 C. FIG. 6 shows the differential voltage curves when the battery temperatures are set to 25 deg C., 45 deg C., and 60 deg C. and the battery is discharged at 1.0 C. Here, "C" represents the rate of the battery current. A value of 1 C is a current value at which a full charge or a full discharge is completed in one hour. For example, if the theoretical capacity of the battery 100 is 2 Ah, then 1 C is 2 A, and 0.5 C is 1 A. In FIG. 5 and FIG. 6, the differential voltage curves at 25 deg C. are shown by solid lines, the differential voltage curves at 45 deg C. are shown by chain lines, and the differential voltage curves at 60 deg C. are shown by dotted lines.

As shown in FIG. 5 and FIG. 6, even when the battery current is the same, the higher the battery temperature, the greater the number of peaks appearing in the differential voltage curves and the larger each peak. Here, a large peak means that the degree of protrusion of the peak is large. In the examples of FIG. 5 and FIG. 6, the difference between the differential voltage (dV/dQ) before and after a peak and the differential voltage (dV/dQ) at the vertex of the peak corresponds to the magnitude of the peak.

The accuracy of the deterioration diagnosis depends on the number and magnitude of peaks; the greater the number of peaks and the larger each peak, the higher the accuracy of the deterioration diagnosis. Therefore, even if the battery current is increased, the accuracy of the deterioration diagnosis can be maintained by increasing the battery temperature accordingly. Thus, as shown in the example of FIG. 3, the diagnosis temperature can be set according to the battery current. The upper limit value of the diagnosis temperature is determined by the specifications of the battery 100. In general, the upper limit value at the time of discharge is higher than the upper limit value at the time of charge. Therefore, the charge/discharge time can be minimized by setting the diagnosis temperature to the upper limit value at the time of discharge and obtaining the current-voltage information while the battery 100 is being discharged.

In this way, by performing the charge/discharge of the battery 100 after raising the battery temperature to the diagnosis temperature, a distinct peak can be made to appear in the differential voltage curve even if the battery current is large. This allows performing the deterioration diagnosis of the battery 100 with high accuracy in a short time.

Also, the charge/discharge rate of the battery 100 depends on the transfer rates of ions and charges in the battery 100. The transfer rates of ions and charges depend on the battery temperature, and the higher the battery temperature, the higher the transfer rates. Therefore, even if the battery current is the same, the higher the battery temperature, the higher the charge/discharge rate of the battery 100. Also from such an aspect, the charge/discharge time can be shortened by performing the charge/discharge of the battery 100 in a state where the battery temperature is raised.

Figure 7:
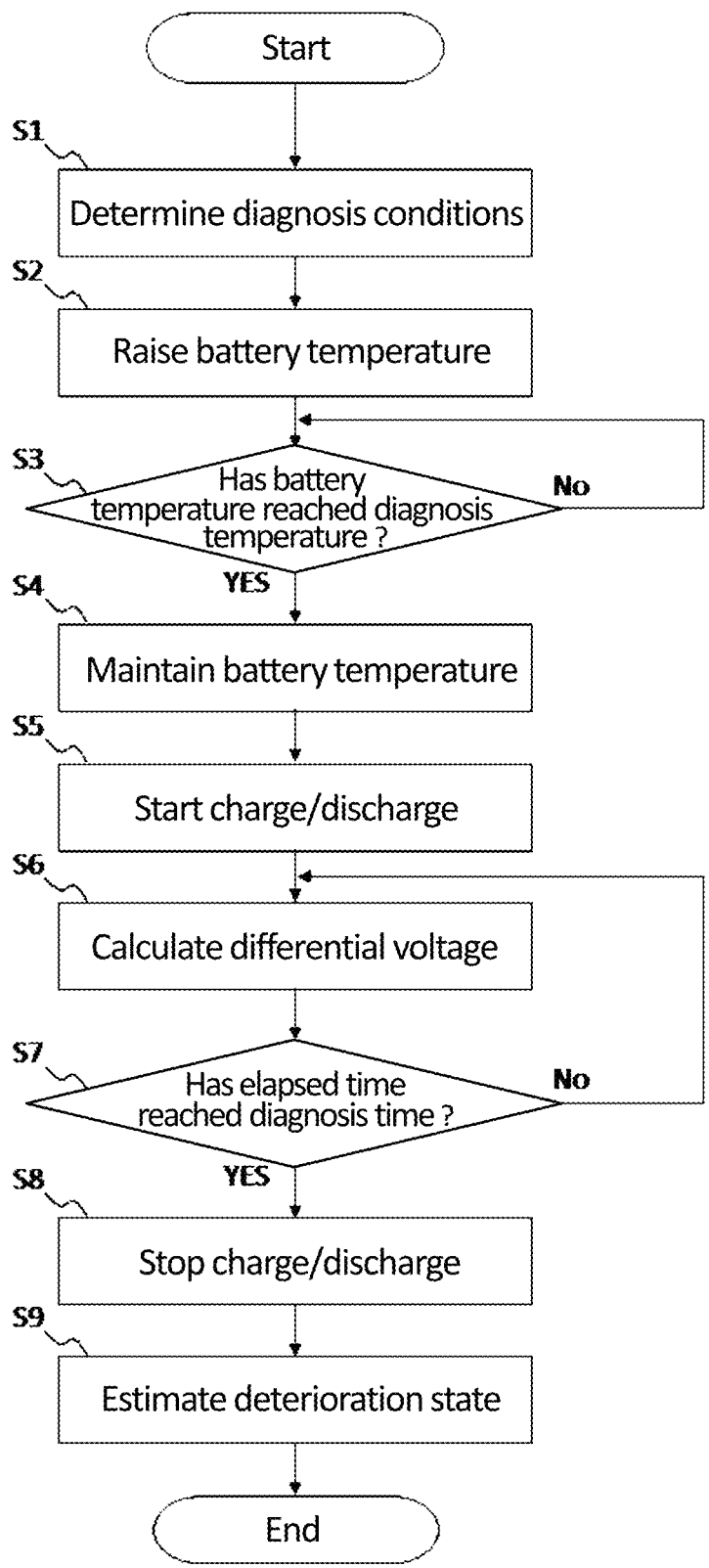
FIG. 7 is a flowchart showing an example of deterioration diagnosis processing by the battery deterioration diagnosis device.

Next, an example of the operation of the battery deterioration diagnosis device 1 will be described. FIG. 7 is a flowchart showing an example of deterioration diagnosis processing performed by the battery deterioration diagnosis device 1. Hereinafter, the time required for the entire deterioration diagnosis processing is referred to as a diagnosis time. Note that the above-mentioned charge/discharge time accounts for the majority of the diagnosis time.

The deterioration diagnosis processing in FIG. 7 is started, for example, in response to an operation by the user on the operation unit not shown in the figure. First, in step S1, the condition determination unit 15 determines the diagnosis conditions. For example, the condition determination unit 15 determines the charge/discharge time on the basis of the input by the user, determines the battery current on the basis of the charge/discharge time, and determines the diagnosis temperature on the basis of the battery current. In this way, the charge/discharge time, the battery current, and the diagnosis temperature are determined as the diagnosis conditions.

Next, in step S2, the temperature-raising control unit 11 controls the temperature raising unit 2 to raise the battery temperature. Next, in step S3, the temperature-raising control unit 11 determines whether or not the battery temperature has reached the diagnosis temperature determined in step S1 on the basis of the temperature information from the temperature detection unit 3. The temperature-raising control unit 11 repeats the determination of step S3 until the battery temperature reaches the diagnosis temperature.

When the battery temperature reaches the diagnosis temperature, the temperature-raising control unit 11 controls the temperature raising unit 2 to maintain the battery temperature in step S4. Next, in step S5, the charge/discharge control unit 12 controls the charge/discharge circuit 4 to start the charge/discharge of the battery 100. In this case, the charge/discharge control unit 12 controls the charge/discharge circuit 4 in such a way that the charge/discharge is performed at the battery current determined in step S1. Note that whether to perform charging or discharging in step S5 may be determined as one of the diagnosis conditions in step S1.

When the temperature-raising control unit 11 is provided in the external device, the charge/discharge control unit 12 may start the charge/discharge of the battery 100 on the basis of the temperature information from the temperature detection unit 3. Specifically, the charge/discharge control unit 12 may determine whether or not the battery temperature has reached the diagnosis temperature on the basis of the temperature information from the temperature detection unit 3, and when the battery temperature has reached the diagnosis temperature, it may control the charge/discharge circuit 4 to start the charge/discharge of the battery 100.

Next, in step S6, the differential voltage calculation unit 13 calculates a differential voltage on the basis of the current-voltage information from the current-voltage detection unit 5. Next, in step S7, the differential voltage calculation unit 13 determines whether or not the elapsed time after starting the charge/discharge in step S5 has reached the charge/discharge time determined in step S1. If the elapsed time has not reached the charge/discharge time, the differential voltage calculation unit 13 performs the processing of step S6. By repeating step S6 until the elapsed time reaches the charge/discharge time, the differential voltage curve representing the change in the differential voltage with respect to the electrical volume is obtained.

When the elapsed time reaches the charge/discharge time, the charge/discharge control unit 12 controls the charge/discharge circuit 4 to stop the charge/discharge of the battery 100 in step S8. In the example of FIG. 7, the charge/discharge control unit 12 performs the charge/discharge of the battery 100 with the battery temperature maintained by the temperature raising unit 2, but the charge/discharge control unit 12 may perform the charge/discharge of the battery 100 with the operation of the temperature raising unit 2 stopped. As described above, because heat is generated by the internal resistance of the battery 100 during the charge/discharge of the battery 100, the decrease in the battery temperature is suppressed even if the operation of the temperature raising unit 2 is stopped.

Next, in step S9, the deterioration state estimation unit 14 estimates the deterioration state of the battery 100 on the basis of the change in the calculated differential voltage. For example, the deterioration state estimation unit 14 estimates the SOH as the deterioration state of the battery 100 on the basis of the shapes of the peaks appearing in the differential voltage curve or the distances between the peaks. The deterioration diagnosis processing is thus completed.

As described above, in Embodiment 1, after the battery temperature rises to the predetermined diagnosis temperature, the charge/discharge of the battery 100 is performed, the differential voltage is calculated on the basis of the battery current and the battery voltage at the time of charge/discharge, and the deterioration state of the battery 100 is estimated on the basis of the change in the differential voltage. Thus, even when the battery current is large, a characteristic change in the differential voltage can be confirmed. Therefore, the deterioration state of the battery 100 can be estimated with high accuracy in a short time. As a result, the deterioration diagnosis of the battery 100 can be performed with high accuracy in a short time.

In Embodiment 1, the battery current is determined on the basis of the charge/discharge time, and the diagnosis temperature is determined on the basis of the battery current. In this case, since the deterioration diagnosis can be performed accurately at a desired charge/discharge time, the charge/discharge time can be flexibly adjusted according to various situations.

Note that frequent recharge/discharge of the battery 100 at a high temperature may also accelerate reactions that cause the battery 100 to deteriorate, which may shorten the life of the battery 100. However, deterioration diagnosis only needs to be performed several tens of times over the life of the battery 100. Such a frequency is unlikely to have a significant impact on the life of the battery 100.

Embodiment 2

Figure 8:
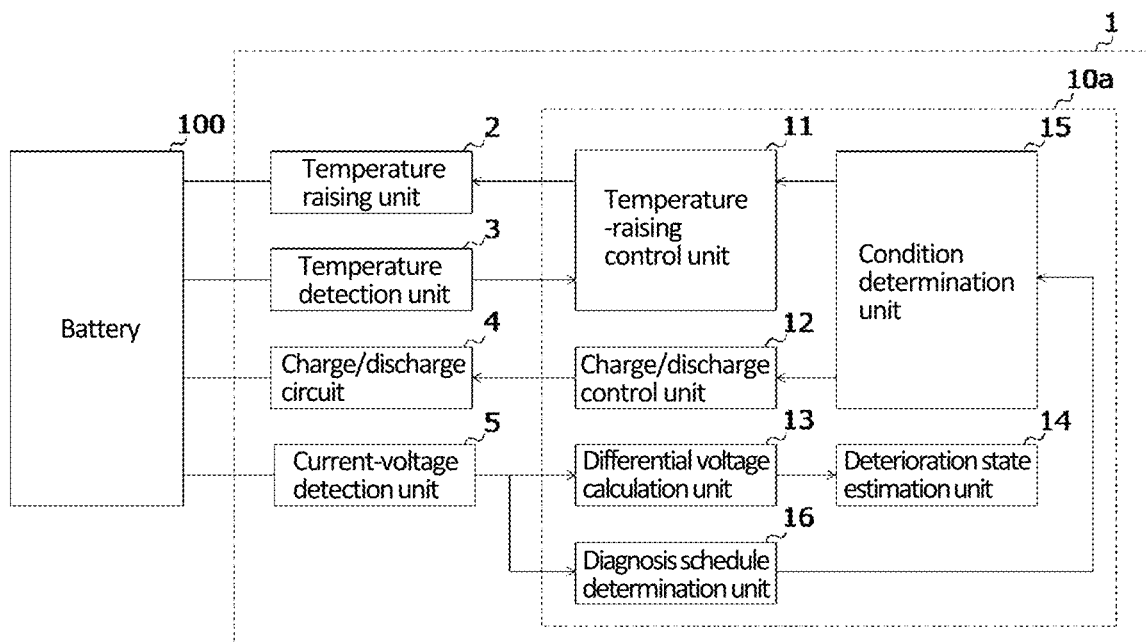
FIG. 8 is a diagram showing an overall configuration of a battery deterioration diagnosis device according to Embodiment 2 of the present disclosure.

A battery deterioration diagnosis device according to Embodiment 2 of the present disclosure will be described focusing on differences from Embodiment 1 described above. FIG. 8 is a diagram showing an overall configuration of the battery deterioration diagnosis device according to Embodiment 2 of the present disclosure. The battery deterioration diagnosis device 1 of FIG. 8 includes a control unit 10a in place of the control unit 10 of FIG. 1. In addition to the components of the control unit 10, the control unit 10a further includes a diagnosis schedule determination unit 16.

The diagnosis schedule determination unit 16 is given the current-voltage information from the current-voltage detection unit 5. The diagnosis schedule determination unit 16 checks the usage history of the battery 100 on the basis of the current-voltage information from the current-voltage detection unit 5, and determines, on the basis of the checked usage history, a time period in which the next deterioration diagnosis should be performed (hereinafter referred to as a scheduled diagnosis time period).

Specifically, the diagnosis schedule determination unit 16 identifies a time period in which the battery 100 is likely to be used (the charge/discharge is likely to be performed) on the basis of the usage history of the battery 100, and determines the scheduled diagnosis time period by avoiding the time period. For example, when the battery 100 is mounted on an electric vehicle, the battery 100 is used for a time period during the day and rarely used for a time period from midnight to early morning. In such a case, the diagnosis schedule determination unit 16 determines part or all of the time period from midnight to early morning as the scheduled diagnosis time period.

Further, the diagnosis schedule determination unit 16 determines a date on which the next deterioration diagnosis should be performed (hereinafter referred to as a scheduled diagnosis date). For example, the diagnosis schedule determination unit 16 determines the date on which the predetermined number of days has passed since the date of the last deterioration diagnosis as the scheduled diagnosis date. The scheduled diagnosis date may be determined on the basis of the result of the last deterioration diagnosis. For example, the worse the deterioration state of battery 100, the shorter the number of days from the date of the last deterioration diagnosis to the scheduled diagnosis date may be set. Alternatively, the scheduled diagnosis date may be determined on the basis of the current-voltage information from the current-voltage detection unit 5. For example, a day of the week on which the battery 100 is rarely used may be identified on the basis of the current-voltage information, and the day of the week on which battery 100 is rarely used among days after the lapse of the predetermined number of days from the date of the last deterioration diagnosis may be determined as the scheduled diagnosis date.

The temperature-raising control unit 11, the charge/discharge control unit 12, the differential voltage calculation unit 13, the deterioration state estimation unit 14, and the condition determination unit 15 perform the above-described deterioration diagnosis processing on the scheduled diagnosis date and the scheduled diagnosis time period determined by the diagnosis schedule determination unit 16. In this case, the condition determination unit 15 determines the charge/discharge time in such a way that it corresponds to the scheduled diagnosis time period, and determines the battery current and the diagnosis temperature from the charge/discharge time as described above.

As described above, in Embodiment 2, the scheduled diagnosis time period is determined on the basis of the usage history of the battery 100, and the deterioration diagnosis is performed during the scheduled diagnosis time period. Thus, the deterioration diagnosis can be performed accurately at an appropriate timing according to the application of the battery 100. In addition, when the battery 100 is incorporated in other equipment, the deterioration diagnosis can be performed without performing complicated work such as removing the battery 100 from the equipment at an appropriate timing when the equipment is not in use.

Embodiment 3

Figure 9:
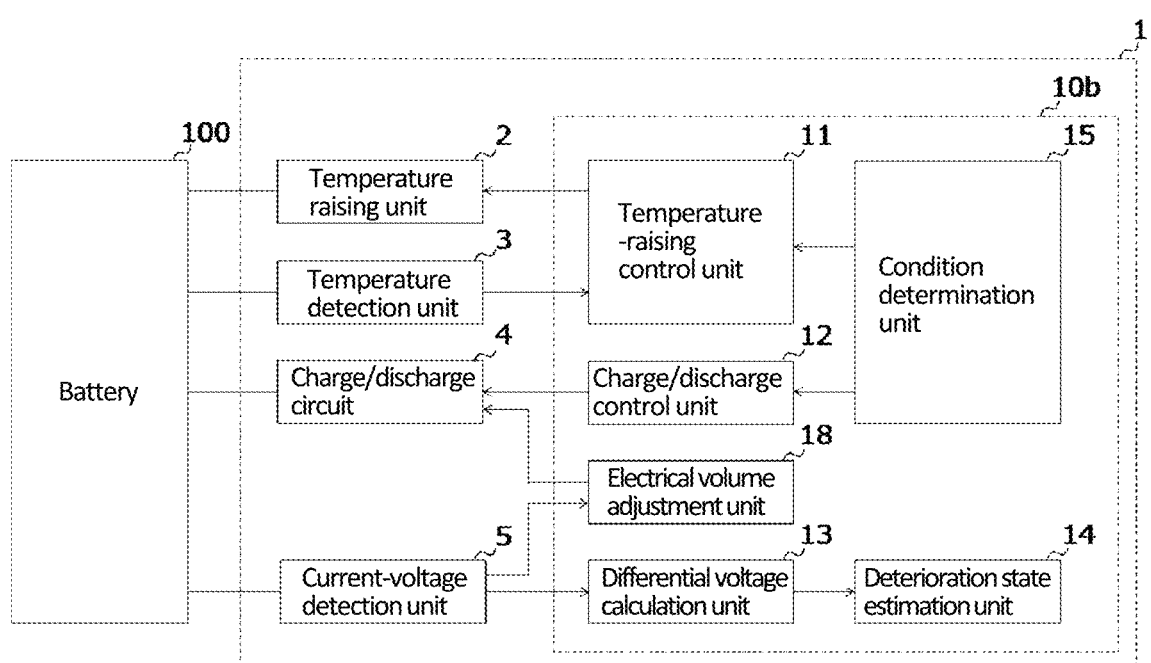
FIG. 9 is a diagram showing an overall configuration of a battery deterioration diagnosis device according to Embodiment 3 of the present disclosure.

A battery deterioration diagnosis device according to Embodiment 3 of the present disclosure will be described focusing on differences from Embodiment 1 described above. FIG. 9 is a diagram showing an overall configuration of the battery deterioration diagnosis device 1 according to Embodiment 3 of the present disclosure. The battery deterioration diagnosis device 1 of FIG. 9 includes a control unit 10b in place of the control unit 10 of FIG. 1. In addition to the components of the control unit 10, the control unit 10b further includes an electrical volume adjustment unit 18.

The electrical volume adjustment unit 18 is given current-voltage information from the current-voltage detection unit 5. Before the charge/discharge of the battery 100 by the charge/discharge control unit 12, the electrical volume adjustment unit 18 controls the charge/discharge circuit 4 on the basis of the current-voltage information from the current-voltage detection unit 5 in such a way that the electrical volume of the battery 100 is outside a predetermined proper range. The proper range is set in a range of the electrical volume where a characteristic peak appears in the differential voltage curve.

As described above, the deterioration state estimation unit 14 estimates the deterioration state of the battery 100 on the basis of, for example, the shapes of the peaks appearing in the differential voltage curve or the distances between the peaks. In this case, in order to improve the accuracy of the estimation, it is preferable that the differential voltage curve be obtained over the entire proper range described above. However, depending on the electrical volume of the battery 100 at the time when the charge/discharge is started by the charge/discharge control unit 12, the differential voltage curve may not include the entire proper range. For example, if the electrical volume of the battery 100 is near the center value of the proper range at the time when the charge/discharge is started by the charge/discharge control unit 12, even if the battery 100 is charged or discharged from that point, a part of the proper range is not included in the differential voltage curve.

Thus, in the present embodiment, before the charge/discharge of the battery 100 by the charge/discharge control unit 12, the electrical volume adjustment unit 18 adjusts the electrical volume of the battery 100 outside the proper range in such a way that the differential voltage curve corresponds to the entire proper range. For example, in the example of FIG. 6 where the battery temperature is 60 deg C. (dotted line), a plurality of characteristic peaks appear in a range where the SOC is from 15% to 75%. In this case, this range of the SOC is set as the proper range, and before the charge/discharge of the battery 100 by the charge/discharge control unit 12, the electrical volume adjustment unit 18 sets the SOC to no less than 75% or no more than 15%. The upper limit value (75%) and the lower limit value (15%) of the proper range are considered to be outside the proper range.

To shorten the diagnosis time, the battery current at the time of adjusting the electrical volume outside the proper range is preferably larger than the battery current at the time of the charge/discharge by the charge/discharge control unit 12. Since the proper range depends on the type, material, etc. of the battery 100, it is preferable that the proper range be set according to the type, material, etc. of the battery 100.

Figure 10:
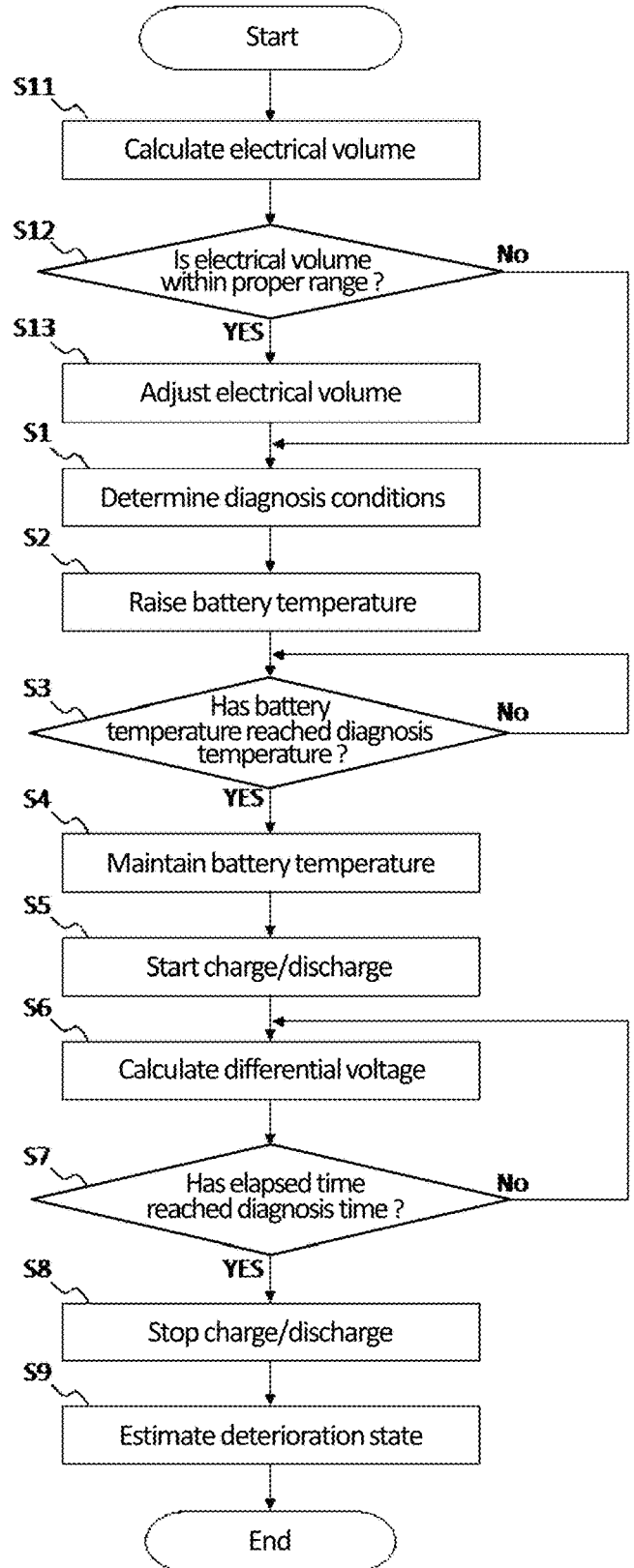
FIG. 10 is a flowchart of an example of deterioration diagnosis processing by the battery deterioration diagnosis device according to Embodiment 3.

FIG. 10 is a flowchart of an example of the deterioration diagnosis processing by the battery deterioration diagnosis device 1 of FIG. 9. The deterioration diagnosis processing of FIG. 10 will be described focusing on differences from the example shown in FIG. 7.

Figure 11:
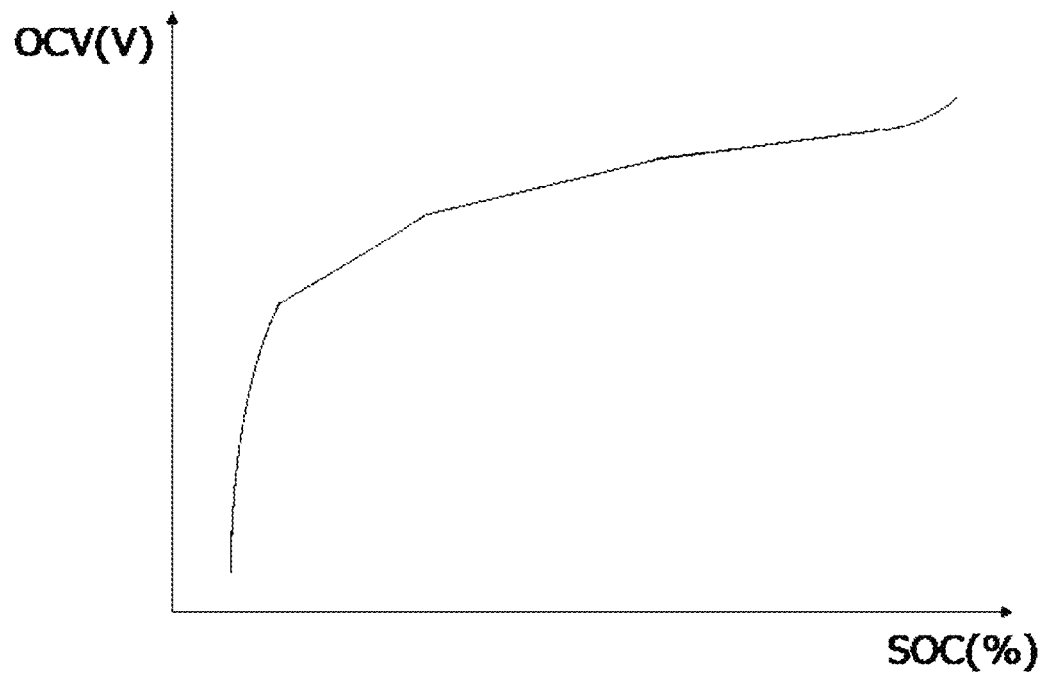
FIG. 11 is a diagram showing a relationship between an SOC and an OCV.

First, in step S11, the electrical volume adjustment unit 18 calculates the electrical volume of the battery 100 on the basis of the current-voltage information from the current-voltage detection unit 5. For example, when the SOC is used as the electrical volume, the SOC can be determined from an Open Circuit Voltage (OCV) of the battery 100. FIG. 11 is a diagram showing the relationship between the SOC and the OCV. In FIG. 11, the horizontal axis represents the SOC, and the vertical axis represents the OCV. As shown in FIG. 11, there is a certain relation between the SOC and the OCV. Therefore, the charge/discharge control unit 12 can uniquely determine the SOC as the electrical volume from the current-voltage information at the time of the open circuit. The method of calculating the electrical volume is not limited to this, and other methods may be used.

Next, in step S12, the electrical volume adjustment unit 18 determines whether or not the electrical volume calculated in step S11 is within the proper range. When the electrical volume is within the proper range, the electrical volume adjustment unit 18 controls the charge/discharge circuit 4, in step S13, in such a way that the electrical volume of the battery 100 is outside the proper range. For example, when the electrical volume of the battery 100 is equal to or larger than the median of the proper range, the electrical volume is adjusted to the upper limit value of the proper range, and when the electrical volume of the battery 100 is smaller than the median of the proper range, the electrical volume is adjusted to the lower limit value of the proper range. When the electrical volume of the battery 100 is within the proper range, the electrical volume may be adjusted to the maximum value (e.g., SOC=100%) or the minimum value (e.g., SOC=0%).

After the electrical volume adjustment by the electrical volume adjustment unit 18, the condition determination unit 15 performs the processing of step S1. When the electrical volume is outside the proper range in step S12, the electrical volume adjustment unit 18 does not adjust the electrical volume, and the condition determination unit 15 performs the processing of step S1. Even if the electrical volume of the battery 100 is outside the proper range, when the electrical volume is far from the upper or lower limit value of the proper range, the electrical volume may be adjusted to the upper or lower limit value of the proper range.

In step S1, the condition determination unit 15 determines the diagnosis conditions so that the electrical volume of the battery 100 will vary throughout the proper range. Specifically, when the electrical volume of the battery 100 is larger than the upper limit value of the proper range at step S1, the charge/discharge time, the battery current, and the diagnosis temperature are determined so that the electrical volume of the battery will reach at least the lower limit value of the proper range. When the electrical volume of the battery 100 is lower than the lower limit value of the proper range at step S1, the charge/discharge time, the battery current, and the diagnosis temperature are determined so that the electrical volume of the battery will reach at least the upper limit value of the proper range.

According to the electrical volume of the battery 100 at step S1, it is determined whether charging or discharging is performed in step S5. Specifically, when the electrical volume of the battery 100 is larger than the upper limit value of the proper range, the battery 100 is discharged in step S5, and when the electrical volume of the battery 100 is lower than the lower limit value of the proper range, the battery 100 is charged in step S5.

As described above, in Embodiment 3, before the recharge/discharge of the battery 100 by the charge/discharge control unit 12, the electrical volume of the battery 100 is adjusted in such a way that the differential voltage curve corresponds to the entire proper range. This allows the deterioration state of the battery 100 to be accurately estimated from the differential voltage curve because the differential voltage curve includes the characteristic peaks.

Embodiment 4

A battery deterioration diagnosis device according to Embodiment 4 of the present disclosure will be described focusing on differences from Embodiment 1 described above.

In Embodiment 4, the temperature raising unit 2 raises the battery temperature by causing a current to flow through the battery 100, that is, by charging/discharging the battery 100. The current that flows through the battery 100 is, for example, a direct current. When the current flows through the battery 100, the internal resistance of the battery 100 causes the battery 100 to heat up. The heat can be used to raise the battery temperature. The temperature raising unit 2 may be provided as a function of the charge/discharge circuit 4. That is, the charge/discharge circuit 4 may charge/discharge the battery 100 as the temperature raising unit 2 to raise the battery temperature.

In the following description, the process of raising the battery temperature to the diagnosis temperature (step S2 in FIG. 7 and FIG. 10) is referred to as a temperature raising process, and the process of calculating the differential voltage while charging/discharging the battery 100 (steps S5 to S8 in FIG. 7 and FIG. 10) is referred to as a differential voltage calculation process.

The amount of heat generated by the internal resistance of the battery 100 can be calculated by multiplying the square of the battery current by the internal resistance value. This means, the larger the battery current, the larger the amount of heat generated. Thus, the battery current in the temperature raising process may be larger than the battery current in the differential voltage calculation process. In this case, the battery temperature can be quickly raised to the diagnosis temperature in the temperature raising process. To raise the battery temperature more quickly, the battery current in the temperature raising process may be the upper limit value on the specifications of the battery 100.

Using the heat generated by the internal resistance of the battery 100 to raise the battery temperature eliminates the need for providing an additional heater or the like, allowing the deterioration diagnosis to be performed in a short time without increasing the number of components. Further, even when the battery 100 is incorporated in other equipment, the battery temperature can be easily raised without removing the battery 100 from the equipment. Note that, depending on the state of the battery 100 at the time of the deterioration diagnosis, the battery temperature may drop in the final stage of the differential voltage calculation process; therefore, the temperature raising unit 2 may be configured to raise the battery temperature using the heat generated by the internal resistance and also to provide the heat to the battery 100 from the outside of the battery 100 by means of a heater or the like.

The temperature raising unit 2 may also have the function of the electrical volume adjustment unit 18 according to Embodiment 3. Specifically, when the electrical volume of the battery 100 is within the proper range at the start of the deterioration diagnosis, the temperature raising unit 2 may charge/discharge the battery 100 to adjust the electrical volume to the outside of the proper range while raising the battery temperature to the diagnosis temperature. In this case, the battery temperature raise and the electrical volume adjustment can be performed at the same time in the temperature raising process. This enables accurate deterioration diagnosis while reducing the diagnosis time.

The temperature raising unit 2 may pass a current containing a frequency component (hereinafter referred to as a ripple current) through the battery 100. Like the internal resistance, the battery 100 has a frequency-dependent impedance. The amount of heat generated when a ripple current flows through the battery 100 can be calculated by multiplying the square of the effective value of the ripple current by the impedance of the battery 100.

However, according to general knowledge, if the state in which the battery voltage instantaneously exceeds the upper limit voltage on the specifications of the battery 100 continues due to the ripple current flowing through the battery 100, the deterioration of the battery 100 progresses. The lower limit voltage of the battery 100 is also specified by the battery manufacturer. The magnitude of the ripple current is preferably adjusted in consideration of the upper limit voltage and lower limit voltage of the battery 100.

Figure 12:
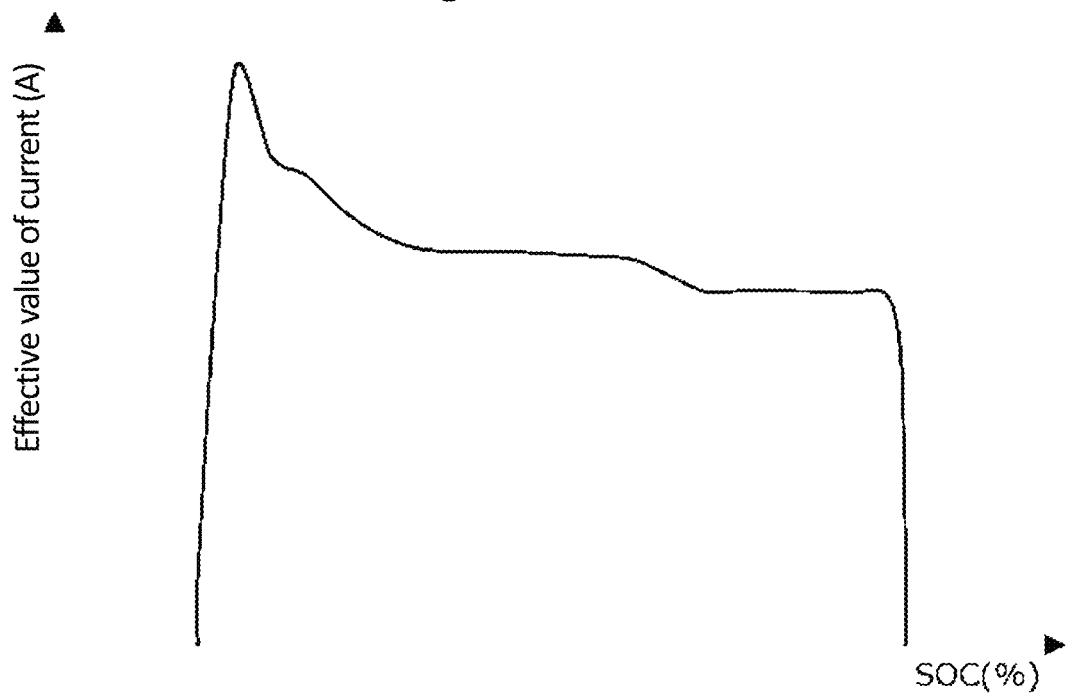
FIG. 12 is a diagram for explaining a preferred ripple current magnitude.

The preferred magnitude of the ripple current depends on the battery volume of the battery 100. FIG. 12 is a diagram for explaining a preferred ripple current. In FIG. 12, the horizontal axis represents the SOC, and the vertical axis represents the effective value of the ripple current. FIG. 12 shows the upper limit value of the ripple current with respect to the SOC. In the example in FIG. 12, when the battery 100 is fully charged (near SOC=100%) or discharged (near SOC=0%), the ripple current can hardly flow through the battery 100. On the other hand, when the SOC of the battery 100 is in the intermediate range, a certain amount of ripple current can flow through the battery 100. The curve shown in FIG. 12 varies depending on the impedance of the battery 100. Therefore, it is preferable to adjust the ripple current according to the battery 100 to be diagnosed.

The following is an example of an operation when the temperature of the battery 100 is raised by the ripple current, and the differences from the examples in FIG. 7 and FIG. 10 will be described. After the condition determination unit 15 determines the diagnosis conditions in step S1, the temperature-raising control unit 11 calculates the magnitude of the ripple current that can raise the battery temperature to the diagnosis temperature, and then determines the range of the electrical volume that can pass the calculated ripple current (hereinafter referred to as a ripple flow range). Next, the temperature-raising control unit 11 controls the charge/discharge circuit 4 in such a way that the electrical volume of the battery 100 falls within the determined ripple flow range. The temperature-raising control unit 11 then controls the temperature raising unit 2 to pass the ripple current through the battery 100. This allows the battery temperature to rise to the diagnosis temperature. Thereafter, the charge/discharge control unit 12 performs the processing of step S5.

The frequency component of the ripple current can raise the battery temperature without changing the electrical volume of the battery 100. Therefore, the use of the ripple current facilitates the adjustment of the electrical volume at the time of temperature rise. For example, by adjusting the electrical volume of the battery 100 within the ripple flow range and then causing the ripple current containing only the frequency component without a DC component to flow through the battery 100, the battery temperature can be raised while maintaining the electrical volume of the battery 100 within the ripple flow range. Also, by causing the ripple current containing both the DC component and the frequency component to flow through the battery 100, the electrical volume can be adjusted while raising the battery temperature. If the current-voltage detection unit 5 can detect the battery current and the battery voltage while filtering out the frequency component, the ripple current may be used in the differential voltage calculation process.

As described above, in Embodiment 4, the temperature of the battery 100 is raised by passing the current through the battery 100 to generate heat by the internal resistance of the battery 100. This allows the deterioration diagnosis to be performed with high accuracy in a short time without increasing the number of components.

Embodiment 5

A battery deterioration diagnosis device according to Embodiment 5 of the present disclosure will be described focusing on differences from Embodiment 1 described above.

Figure 13:
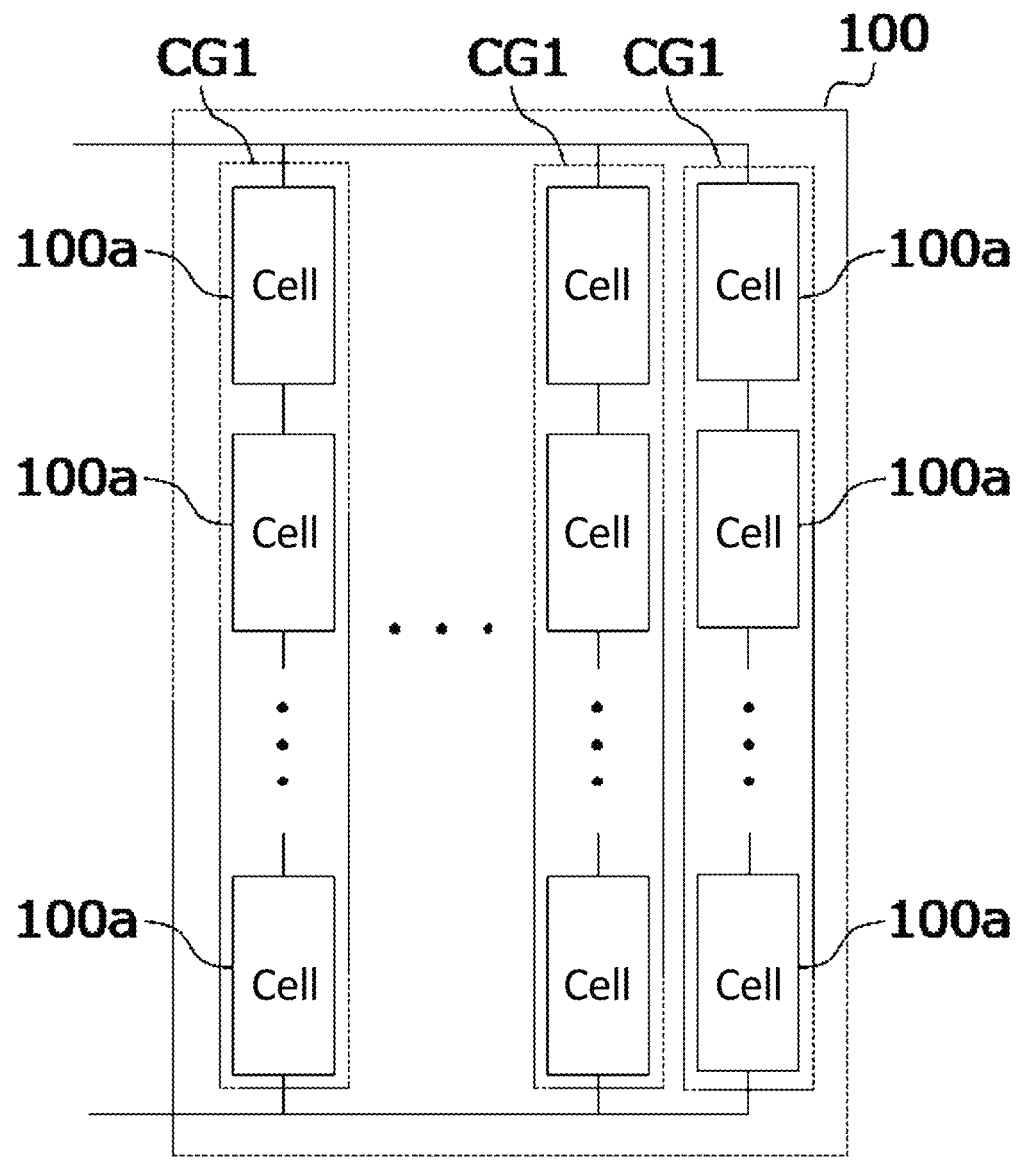
FIG. 13 is a diagram showing a configuration example of a battery according to Embodiment 5 of the present disclosure.
Figure 14:
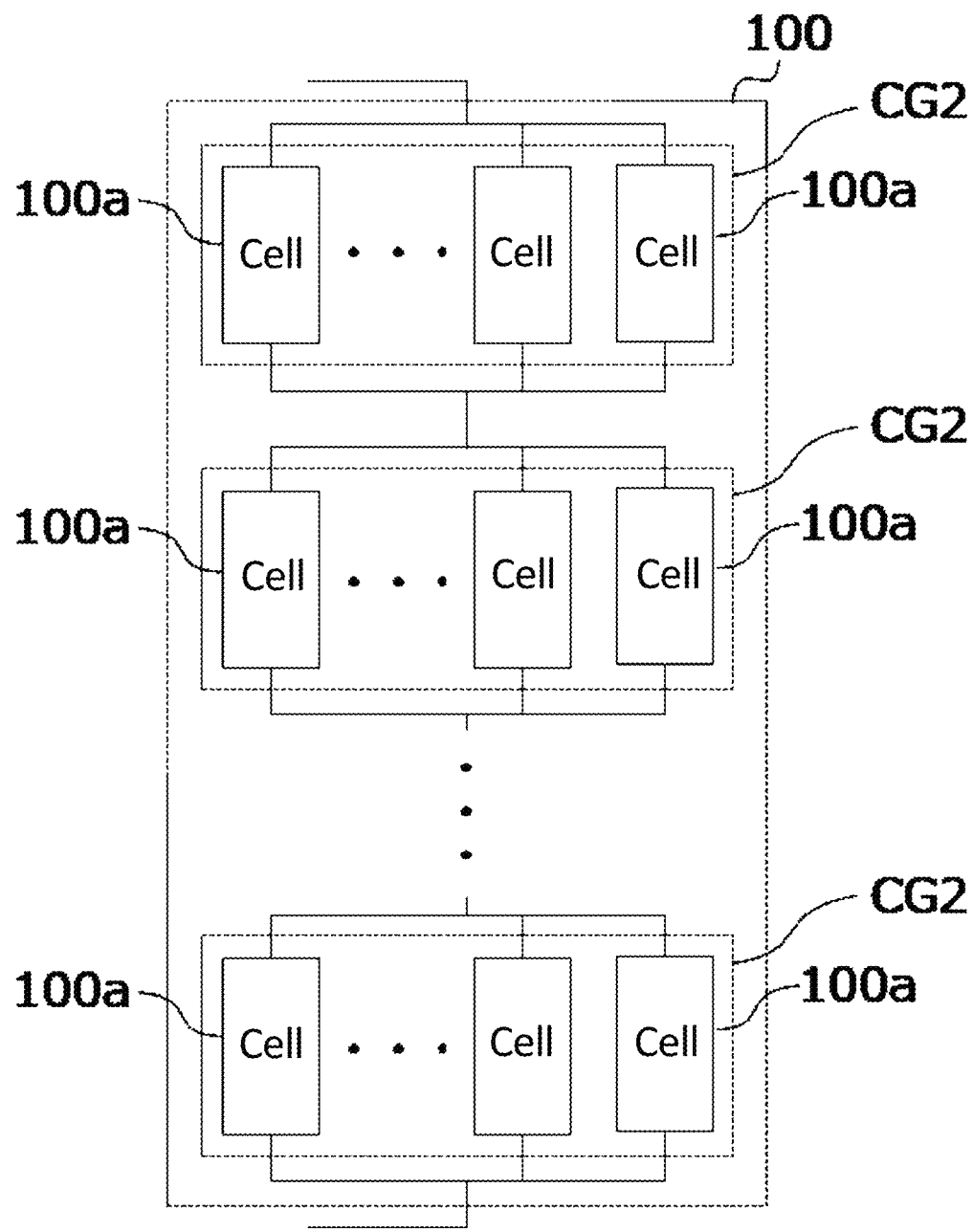
FIG. 14 is a diagram showing a configuration example of the battery according to Embodiment 5 of the present disclosure.

FIG. 13 and FIG. 14 are diagrams showing configuration examples of a battery 100 according to Embodiment 5 of the present disclosure. As shown in FIG. 13 and FIG. 14, in the present embodiment, the battery 100 includes a plurality of cells (unit cells) 100*a*.

The battery 100 shown in FIG. 13 includes a plurality of cell groups CG1 connected in parallel to each other. Each cell group CG1 includes the plurality of cells 100*a* connected in series to each other. The battery 100 of FIG. 14 includes a plurality of cell groups CG2 connected in series to each other. Each cell group CG2 includes the plurality of cells 100*a* connected in parallel to each other.

When the battery 100 is actually mounted on a home electric appliance or an electric apparatus such as an electric automobile, a single cell 100*a* is rarely used, but as shown in the examples of FIG. 13 and FIG. 14, modules each consisting of a plurality of cells 100*a* connected in series or parallel are often used.

In the case where the battery 100 includes the plurality of cells 100*a* as in the examples in FIG. 13 and FIG. 14, if the temperature raising unit 2 such as a heater is provided for each cell 100*a*, the cost increases. Therefore, the temperature raising unit 2 may be provided for only a part (for example, one) of the plurality of cells 100*a*. When the plurality of cells 100*a* are used as the battery 100, the deterioration of each cell 100*a* proceeds substantially in the same manner. Therefore, the deterioration state of at least a part of the cells 100*a* is estimated by the deterioration diagnosis described above, and the other cells 100*a* are assumed to be in the same deterioration state as that of the part of the cells 100*a*. This enables accurate deterioration diagnosis in a short time while suppressing complication of the configuration and increase of the cost.

OTHER EMBODIMENTS

In the above-described embodiments, the differential voltage calculation unit 13 calculates, as the differential voltage, dV/dQ, which is a value obtained by differentiating the battery voltage V by the electrical volume Q; however, the differential voltage calculation unit 13 may also calculate, as the differential voltage, dQ/dV, which is a value obtained by differentiating the electrical volume Q by the battery voltage V. Also in this case, the deterioration state of the battery 100 can be estimated on the basis of the change in the calculated differential voltage. As in the above-described embodiments, the charge/discharge of the battery 100 is performed after the battery temperature has risen to the diagnosis temperature, allowing confirmation of the characteristic change in the differential voltage even when the battery current is large. This allows the deterioration state of the battery 100 to be estimated in a short time with high accuracy.

In the above-described embodiments, the deterioration state estimation unit 14 estimates the deterioration state on the basis of the peaks appearing in the differential voltage curve, but the method of estimating the deterioration state is not limited to this.

Figure 15:
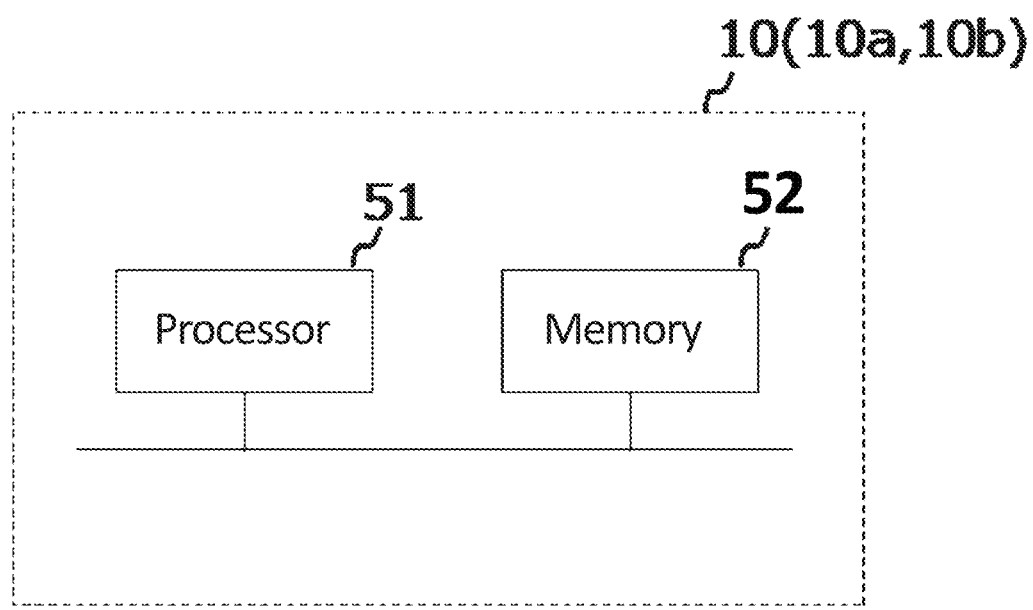
FIG. 15 is a diagram showing an example in which at least a part of functions of a control unit is realized by software.

The functions of the temperature-raising control unit 11, the charge/discharge control unit 12, the differential voltage calculation unit 13, the deterioration state estimation unit 14, the condition determination unit 15, the diagnosis schedule determination unit 16, and the electrical volume adjustment unit 18 in the control units 10a, 10b may be realized by hardware, such as electronic circuitry, or by software. FIG. 15 is a diagram showing an example in which at least a part of the functions of the control unit 10 (10a, 10b) are realized by software. In the example of FIG. 15, the control unit 10 (10a, 10b) includes a processing unit (processor) 51 and a storage unit (memory) 52. The processing unit 51 is a Central Processing Unit (CPU), for example, and reads and executes a program stored in the storage unit 52 to realize the functions of the temperature-raising control unit 11, the charge/discharge control unit 12, the differential voltage calculation unit 13, the deterioration state estimation unit 14, the condition determination unit 15, the diagnosis schedule determination unit 16, and the electrical volume adjustment unit 18. The processing unit 51 may be an Application Specific Integrated Circuit (ASIC), a Digital Signal Processor (DSP), a Field Programmable Gate Array (FPGA), or the like. The storage unit 52 may be a Read Only Memory (ROM), a Random Access Memory (RAM), a Hard Disk Drive (HDD), or the like.

REFERENCE SIGNS LIST 1 battery deterioration diagnosis device
2 temperature raising unit
3 temperature detection unit
4 charge/discharge circuit
5 current-voltage detection unit
10 a, 10b control unit
11 temperature-raising control unit
12 charge/discharge control unit
13 differential voltage calculation unit
14 deterioration state estimation unit
15 condition determination unit
16 diagnosis schedule determination unit
18 electrical volume adjustment unit
100 battery

The invention claimed is:

1. A battery deterioration diagnosis device that performs deterioration diagnosis of a battery, the device comprising:
charge/discharge circuitry to charge or discharge the battery;
charge/discharge control circuitry to control the charge/discharge circuitry in such a way that the battery is charged or discharged after a temperature of the battery rises to a predetermined diagnosis temperature;
a current-voltage detector to detect current and voltage of the battery during a period in which the battery is charged or discharged by the charge/discharge control circuitry;
differential voltage calculation circuitry to calculate a differential value of the voltage of the battery as a differential voltage on a basis of the current and voltage detected by the current-voltage detector; and
deterioration state estimation circuitry to estimate a deterioration state of the battery on a basis of a change in the differential voltage calculated by the differential voltage calculation circuitry, wherein
the higher the diagnosis temperature, the larger the current during charging or discharging of the battery by the charge/discharge control circuitry.

2. The battery deterioration diagnosis device according to claim 1, wherein the deterioration state estimation circuitry estimates the deterioration state of the battery on a basis of a peak of a differential voltage curve representing the change in the differential voltage with respect to an electrical volume of the battery.

3. The battery deterioration diagnosis device according to claim 2, further comprising electrical volume adjustment circuitry to adjust the electrical volume of the battery before charging or discharging the battery by the charge/discharge control circuitry in such a way that the differential voltage curve corresponds to an entire predetermined range of the electrical volume.

4. The battery deterioration diagnosis device according to claim 1, further comprising condition determination circuitry to determine a time during which the battery is charged or discharged by the charge/discharge control circuitry as a charge/discharge time, and to determine the diagnosis temperature on a basis of the determined charge/discharge time, wherein
the charge/discharge control circuitry controls the charge/discharge circuitry on a basis of the charge/discharge time and the diagnosis temperature determined by the condition determination circuitry.

5. The battery deterioration diagnosis device according to claim 4, wherein
the condition determination circuitry determines a current of the battery during charging or discharging of the battery by the charge/discharge control circuitry on a basis of the charge/discharge time, and determines the diagnosis temperature on a basis of the determined current, and
the charge/discharge control circuitry controls the charge/discharge circuitry on a basis of the charge/discharge time, the current, and the diagnosis temperature determined by the condition determination circuitry.

6. The battery deterioration diagnosis device according to claim 1, further comprising a diagnosis schedule determination circuitry to determine a time period in which a next deterioration diagnosis should be performed on a basis of a usage history of the battery.

7. The battery deterioration diagnosis device according to claim 1, further comprising:
temperature raising circuitry to raise the temperature of the battery;
a temperature detector to detect the temperature of the battery; and
temperature-raising control circuitry to control the temperature raising circuitry in such a way that the temperature of the battery rises to the diagnosis temperature on a basis of the temperature detected by the temperature detector.

8. The battery deterioration diagnosis device according to claim 7, wherein the temperature raising circuitry raises the temperature of the battery by passing a current through the battery to generate heat by an internal resistance of the battery.

9. The battery deterioration diagnosis device according to claim 8, wherein the temperature raising circuitry raises the temperature of the battery by passing a current containing a frequency component through the battery.

10. The battery deterioration diagnosis device according to claim 9, wherein the temperature-raising control circuitry controls the temperature raising circuitry in such a way that the temperature of the battery rises to the diagnosis temperature after an electrical volume of the battery is adjusted to correspond to a magnitude of the current containing the frequency component.

11. The battery deterioration diagnosis device according to claim 7, wherein
the battery includes a plurality of unit cells, and
the temperature raising circuitry is provided for only part of the plurality of unit cells.

12. A battery deterioration diagnosis method of performing deterioration diagnosis of a battery, the method comprising:
raising a temperature of the battery to a predetermined diagnosis temperature;
charging or discharging the battery after the temperature of the battery rises to the diagnosis temperature;
detecting current and voltage of the battery during a period in which the battery is charged or discharged;
calculating a differential value of the voltage of the battery as a differential voltage on a basis of the detected current and voltage; and
estimating a deterioration state of the battery on a basis of a change in the calculated differential voltage, wherein
the higher the diagnosis temperature, the larger the current during the charging or the discharging of the battery.

13. A battery deterioration diagnosis device that performs deterioration diagnosis of a battery, the device comprising:
charge/discharge circuitry to charge or discharge the battery;
charge/discharge control circuitry to control the charge/discharge circuitry in such a way that the battery is charged or discharged after a temperature of the battery rises to a predetermined diagnosis temperature;
a current-voltage detector to detect current and voltage of the battery during a period in which the battery is charged or discharged by the charge/discharge control circuitry;
differential voltage calculation circuitry to calculate a differential value of the voltage of the battery as a differential voltage on a basis of the current and voltage detected by the current-voltage detector;
deterioration state estimation circuitry to estimate a deterioration state of the battery on a basis of a change in the differential voltage calculated by the differential voltage calculation circuitry; and
condition determination circuitry to determine a time during which the battery is charged or discharged by the charge/discharge control circuitry as a charge/discharge time, and to determine the diagnosis temperature on a basis of the determined charge/discharge time, wherein
the charge/discharge control circuitry controls the charge/discharge circuitry on a basis of the charge/discharge time and the diagnosis temperature determined by the condition determination circuitry.

* * * * *